United States Patent
Wu et al.

(10) Patent No.: US 11,948,928 B2
(45) Date of Patent: Apr. 2, 2024

(54) DISPLAY APPARATUS AND MANUFACTURING METHOD THEREOF

(71) Applicant: Au Optronics Corporation, Hsinchu (TW)

(72) Inventors: Yang-En Wu, Hsinchu (TW); Shih-Hsiung Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 335 days.

(21) Appl. No.: 17/377,401

(22) Filed: Jul. 16, 2021

(65) Prior Publication Data

US 2022/0254766 A1 Aug. 11, 2022

(30) Foreign Application Priority Data

Feb. 8, 2021 (TW) .................. 110104615

(51) Int. Cl.
*H01L 25/16* (2023.01)
*H01L 23/00* (2006.01)

(52) U.S. Cl.
CPC ............ *H01L 25/167* (2013.01); *H01L 24/95* (2013.01); *H01L 24/08* (2013.01); *H01L 24/80* (2013.01); *H01L 2224/08225* (2013.01); *H01L 2224/80815* (2013.01); *H01L 2224/95001* (2013.01); *H01L 2924/12041* (2013.01); *H01L 2924/13069* (2013.01)

(58) Field of Classification Search
CPC ....... H01L 25/167; H01L 24/95; H01L 24/08; H01L 24/80; H01L 2224/08225; H01L 2224/80815; H01L 2224/95001; H01L 2924/12041; H01L 2924/13069; H01L 24/16; H01L 24/81; H01L 2221/68368; H01L 2221/68381; H01L 2224/13023; H01L 21/6835; H01L 2224/16225; H01L 2224/81001; H01L 2224/81097; H01L 2224/81191; H01L 2224/81224; H01L 2224/95136; H01L 33/0093; H01L 33/62; H01L 2933/0066
USPC .......................................... 257/89
See application file for complete search history.

(56) References Cited

U.S. PATENT DOCUMENTS

| | | | |
|---|---|---|---|
| 10,177,123 B2 * | 1/2019 | Gardner | H01L 25/0753 |
| 10,304,787 B2 * | 5/2019 | Suzuki | H01L 25/167 |
| 10,546,796 B2 * | 1/2020 | Hu | H01L 25/167 |
| 10,890,801 B2 | 1/2021 | Wang et al. | |
| 2007/0295975 A1 * | 12/2007 | Omae | H05B 45/40 257/89 |
| 2017/0301660 A1 * | 10/2017 | Pokhriyal | H01L 21/6835 |
| 2018/0247922 A1 * | 8/2018 | Robin | H01L 33/007 |
| 2019/0285946 A1 | 9/2019 | Wang et al. | |
| 2021/0134773 A1 * | 5/2021 | Onuma | H01L 27/156 |

FOREIGN PATENT DOCUMENTS

| | | |
|---|---|---|
| CN | 107193158 | 9/2017 |
| CN | 108922884 | 11/2018 |
| CN | 110767669 | 2/2020 |

* cited by examiner

*Primary Examiner* — Vu A Vu
(74) *Attorney, Agent, or Firm* — JCIPRNET

(57) ABSTRACT

A display apparatus, including a circuit substrate, a driving unit and a light-emitting unit is provided. The driving unit is disposed on the circuit substrate. The light-emitting unit is disposed on the circuit substrate. A thickness of the driving unit is substantially the same as a thickness of the light-emitting unit.

17 Claims, 6 Drawing Sheets

DISPLAY APPARATUS AND MANUFACTURING METHOD THEREOF

CROSS-REFERENCE TO RELATED APPLICATION

This application claims the priority benefit of Taiwan application serial no. 110104615, filed on Feb. 8, 2021. The entirety of the abovementioned patent application is hereby incorporated by reference herein and made a part of this specification.

BACKGROUND

Technical Field

This disclosure relates to an electronic device, and in particular to a display apparatus.

Description of Related Art

A light-emitting diode (LED) has advantages such as long lifespan, small size, high shock resistance, low heat generation and low power consumption, therefore it has been widely applied to indicators or light sources in households appliances and various equipment. However, how to manufacture a display apparatus with a light-emitting diode in a relatively simple means and still maintain the manufacturing cost, yield, and/or quality of the display apparatus remains a challenge for those skilled in the art.

SUMMARY

This disclosure provides a display apparatus and a manufacturing method thereof, which may have a lower manufacturing cost and/or a better yield or quality.

The display apparatus of the disclosure includes a circuit substrate, a driving unit, and a light-emitting unit. The driving unit is disposed on the circuit substrate. The light-emitting unit is disposed on the circuit substrate. A thickness of the driving unit is substantially same as a thickness of the light-emitting unit.

The manufacturing method of the display apparatus of the disclosure includes the following steps. A circuit substrate is provided. A driving unit is disposed on the circuit substrate. And, a light-emitting unit is disposed on the circuit substrate, in which a thickness of the driving unit is substantially the same as a thickness of the light-emitting unit.

Based on the above, the display apparatus and the manufacturing method thereof of the disclosure may have a lower manufacturing cost and/or a better yield or quality.

DESCRIPTION OF THE EMBODIMENTS

Figure 1A:
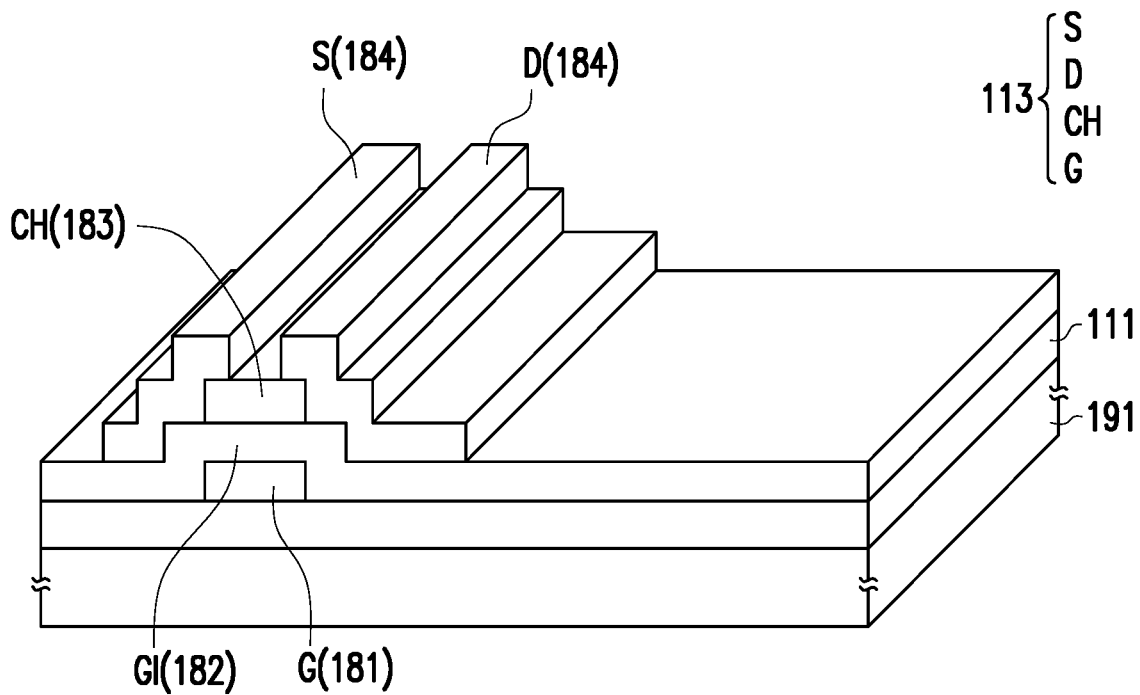
FIG. 1A is a partial perspective view of a part of a manufacturing method of a display apparatus according to a first embodiment of the disclosure.

To make the abovementioned more comprehensible, several embodiments accompanied by drawings are described in detail as follows. As those skilled in the art would be aware, the described embodiments may be modified in various different ways without departing from the spirit or scope of the disclosure.

In the drawings, the thickness of each element and the like are exaggerated for clarity. Throughout the specification, the same reference numerals denote the same elements. It should be understood that when an element such as a layer, film, region, or substrate is referred to as being "on", "connected to", or "overlaps" another element, it may be directly on the other element or connected to the other element, or an intermediary elements may also be present. In contrast, when an element is referred to as being "directly on" or "directly connected to" another element, there are no intermediary elements. As used herein, "connected to" may refer to physical and/or electrical connections.

It should be understood that although the terms "first", "second", "third", etc. may be used herein to describe various elements, components, regions, layers and/or parts, these elements, components, regions, and/or parts are not limited by these terms. These terms are only used to distinguish an element, component, region, layer or part from another element, component, region, layer or part. Therefore, the "first element", "component", "region", "layer", or "part" discussed below may also be referred to as a second element, component, region, layer or part without departing from the teachings herein.

The terminology used here is only for the purpose of describing specific embodiments and is not limiting. As used herein, unless the content clearly indicates otherwise, the singular forms "a", "an", and "the" are intended to include plural forms, including "at least one". "Or" means "and/or". As used herein, the term "and/or" includes any and all combinations of one or more of the related listed items. It should also be understood that when used in this specification, the terms "including" and/or "containing" designate the presence of the feature, region, overall apparatus, step, operation, element, and/or components, but do not exclude the presence or addition of one or more of other features, regions, overall apparatus, steps, operations, elements, components, and/or combinations thereof.

In addition, relative terms such as "lower" or "bottom" and "upper" or "top" may be used herein to describe the relationship between an element and another element, as shown in the drawings. It should be understood that the relative terms are intended to include different orientations of the device in addition to the orientation shown in the drawings. For example, if an apparatus in a drawing is being turned over, elements described as being on the "lower" side of other elements will be oriented to be on the "upper" side of the other elements. Therefore, the exemplary term "lower" may include orientations of "lower" and "upper", depending on the specific orientation of the drawing. Similarly, if an apparatus in a drawing is being turned over, elements described as "below" or "beneath" other elements will be oriented to be "above" the other elements. Thus, the exemplary terms "below" or "beneath" may include orientations of "above" and "below".

Unless otherwise defined, all terms (including technical and scientific terms) used herein have the same meaning as understood by those of ordinary skill in the art. It should be further understood that the terms such as those defined in dictionaries commonly used should be interpreted as having meanings consistent with their meanings in the context of related technologies and the disclosure, and should not be interpreted as having meanings that are idealized or excessively formalized, unless explicitly defined as such in the text.

The exemplary embodiments are described herein with reference to cross-sectional views that are schematic diagrams of idealized embodiments. Therefore, a change in the shape of the illustration as a result of, for example, manufacturing technology and/or tolerances may be expected. Therefore, the embodiments described herein should not be construed as being limited to a specific shape of an area as shown herein, but include, for example, shape deviations caused by manufacturing. For example, regions shown or described as flat may generally have rough and/or non-linear characteristics. In addition, a sharp angle shown may be rounded. Therefore, the regions shown in the drawings are schematic in nature, and their shapes are not intended to show the precise shape of the regions, and are not intended to limit the scope of the claims.

FIG. 1A is a partial perspective view of a part of a manufacturing method of a display apparatus according to a first embodiment of the disclosure. FIGS. 1B to 1F are schematic partial cross-sectional views of a part of a manufacturing method of a display apparatus according to the first embodiment of the disclosure.

With reference to FIG. 1A, a matrix 111 is formed on a fabricated carrier board 191.

In the embodiment, the fabricated carrier board 191 may be an insulating material. For example, the fabricated carrier board 191 may include glass, but the disclosure is not limited thereto.

In the embodiment, the matrix 111 may be formed on the fabricated carrier board 191 by coating or pasting. For example, the matrix 111 may be a polyimide (PI) layer formed by coating or pasting, but the disclosure is not limited thereto.

With reference to FIG. 1A again, a corresponding film layer is formed on the fabricated carrier board 191. For example, a corresponding first electrically conductive layer 181, an insulation layer 182, a semiconductor layer 183, and a second electrically conductive layer 184 the may be formed on the matrix 111 through a commonly used low temperature poly-silicon process (LTPS process). As compared to a chip semiconductor process performed on a silicon wafer, the cost of the aforementioned low temperature poly-silicon process may be lower. The first electrically conductive layer 181, the insulation layer 182, the semiconductor layer 183, and/or the second electrically conductive layer 184 may have corresponding patterns according to design requirements. In addition, for clarity, FIG. 1A only exemplarily shows the matrix 111, the first electrically conductive layer 181, the insulation layer 182, the semiconductor layer 183, and the second electrically conductive layer 184 that are formed on the carrier board 191.

A part of the first electrically conductive layer 181 may be referred to as a gate G. At least a part of the insulation layer 182 may be referred to as a gate insulation layer GI. At least a part of the semiconductor layer 183 may be referred to as a channel CH. A part of the second electrically conductive layer 184 may be referred to as a source S. Another part of the second electrically conductive layer 184 may be referred to as a drain D. The source S, the drain D, the channel CH, and the gate G may form a driving element 113.

In FIG. 1A, the driving element 113 is a bottom gate thin film transistor as an example, but the disclosure is not limited thereto. In other embodiments not shown, the driving element similar to the driving element 113 may be a top gate thin film transistor, a dual gate thin film transistor, or other similar transistors.

In addition, in other embodiments not shown or in regions not shown in FIG. 1A, there may be other film layers on the fabricated carrier board 191 according to the design requirements. The corresponding film layer may form other corresponding elements (such as a capacitor, a conductive wire or a contact pad, but are not limited thereto), and the elements may be electrically connected according to the design requirements. In addition, only one driving element 113 is exemplarily shown in FIG. 1A, but the disclosure does not limit the number of elements (such as the driving element 113) on the fabricated carrier board 191.

In addition, in the subsequent drawings, for clarity, the driving element 113 is only schematically shown.

Figure 1B:
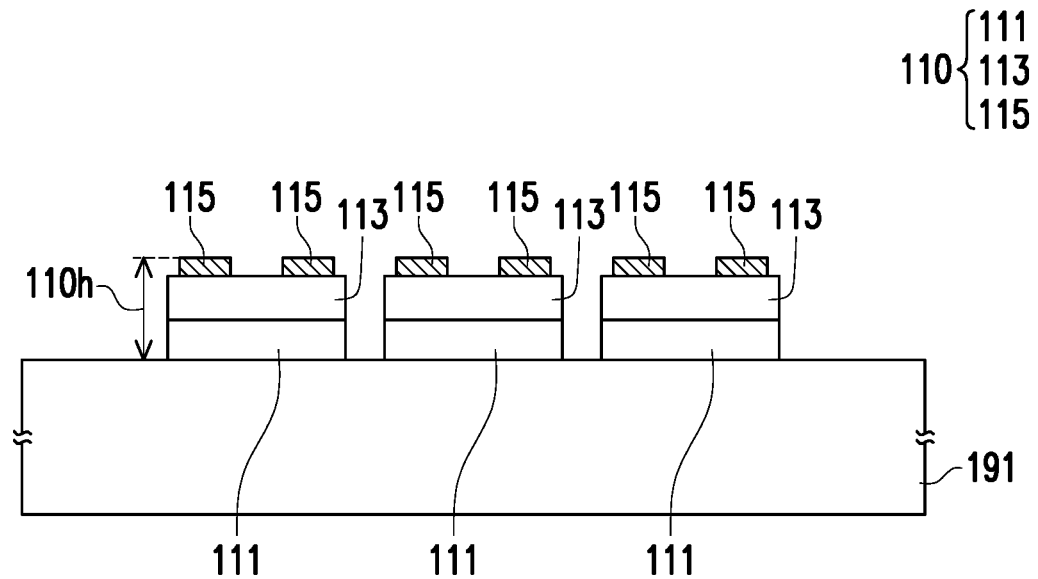
FIGS. 1B to 1F are schematic partial cross-sectional views of a part of a manufacturing method of a display apparatus according to the first embodiment of the disclosure.

With reference to FIG. 1B, in the embodiment, multiple first electrically conductive terminals 115 may be formed on the fabricated carrier board 191. The first electrically conductive terminals 115 may be electrically connected to the driving element 113. For example, one of the multiple first electrically conductive terminals 115 may be electrically connected to the source S (marked in FIG. 1A) in a corresponding driving element 113, and another one of the multiple first electrically conductive terminals 115 may be electrically connected to the drain D in the corresponding driving element 113 (marked in FIG. 1A), and yet another of the first electrically conductive terminals 115 may be electrically connected to the gate G in the corresponding driving element 113 (marked in FIG. 1A).

In FIG. 1B, only a number of possible first electrically conductive terminals 115 or a corresponding configuration means thereof in a cross-sectional view are shown as an example. The number of the first electrically conductive terminals 115 or the corresponding configuration means may be adjusted according to the design requirements, which are not limited by the disclosure.

In the embodiment, a material of the first electrically conductive terminal 115 may include tin (Sn), indium (In), bismuth (Bi), a combination of the above (such as tin/bismuth (Sn/Bi), tin/indium (Sn/In), but are not limited thereto), alloys containing the above (such as tin/copper (Sn/Cu), tin/silver (Sn/Ag), tin/antimony (Sn/Sb), tin/zinc (Sn/Zn), tin/silver/copper (Sn/Ag/Cu), tin/silver/copper/bismuth (Sn/Ag/Cu/Bi), but are not limited thereto) or other suitable solders. For example, a melting point of the solder may be lower than 260° C. In an embodiment, the first electrically conductive terminal 115 may be formed by evaporation, electroplating, or other suitable means, but the disclosure is not limited thereto.

In the embodiment, the matrix 111 may be patterned according to the design requirements. A corresponding driving element 113, a corresponding matrix 111, and a corresponding first electrically conductive terminal 115 may form a driving unit 110. In addition, the disclosure does not limit the number of the driving elements 113, the first electrically conductive terminals 115 and/or the number of other elements not shown in each driving unit 110.

In an embodiment, a thickness 110$h$ of the driving unit 110 may be easily adjusted by using a solder with a melting point lower than 260° C.

Figure 1C:
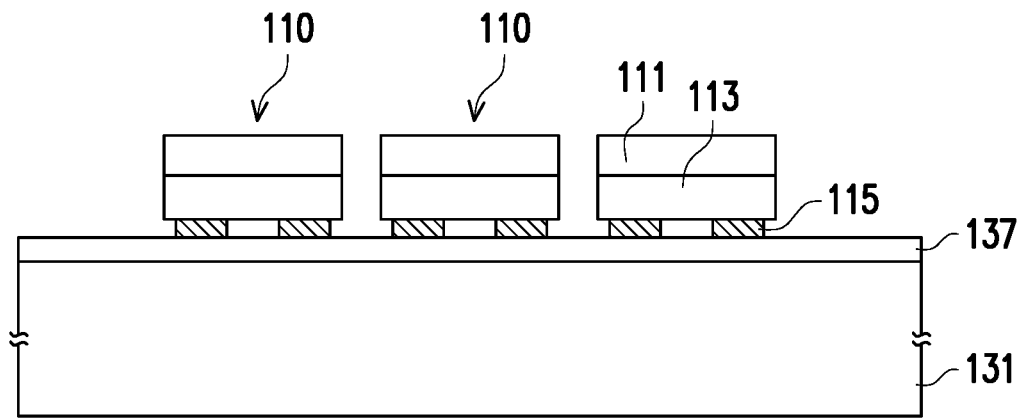

With reference to FIGS. 1B and 1C, in the embodiment, the driving unit 110 may be transferred to a first transfer carrier board 131, but the disclosure is not limited thereto. The first electrically conductive terminals 115 of the driving unit 110 may be facing the first transfer carrier board 131. In addition, the disclosure does not limit a number or an arrangement of the driving units 110 on the first transfer carrier board 131.

In the embodiment, there may be a corresponding release layer 137 between the driving units 110 and the first transfer carrier board 131. In the embodiment, the release layer 137 is disposed on an entire surface, but the disclosure is not limited thereto. In an embodiment, the release layer 137 may be patterned or omitted.

Figure 1D:
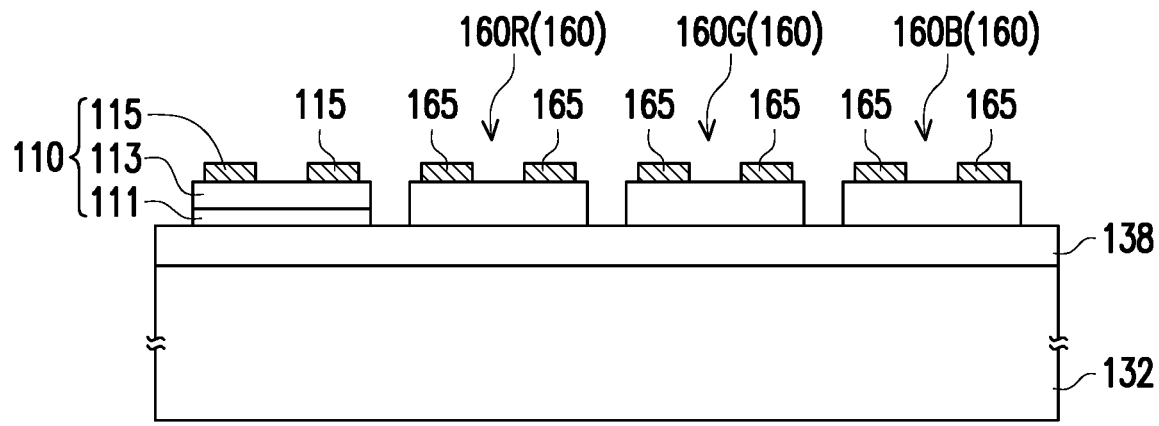

With reference to FIG. 1D, the driving unit 110 is transferred to a second transfer carrier board 132. In the embodiment, as shown in FIGS. 1C and 1D, the driving unit 110 on the first transfer carrier board 131 may be transferred to the second transfer carrier board 132 by laser selective transfer or other suitable means. For example, the driving units 110 on the first transfer carrier board 131 may be made to face the second transfer carrier board 132. Then, the release layer 137 in a specific region on the first transfer carrier board 131 is enabled to generate a surface change by means of a laser, so that a corresponding driving unit 110 may be transferred to the second transfer carrier board 132.

In an embodiment, the above laser-driven means may include a selective laser transfer process, a selective laser lift-off process, or other similar laser propulsion transfer process, but the disclosure is not limited thereto.

In FIG. 1D, a light-emitting unit 160 may be transferred to the second transfer carrier board 132 by the same or similar transfer means as described above. It should be noted that the disclosure does not limit a transfer sequence of the driving unit 110 and the light-emitting unit 160.

In the embodiment, the light-emitting unit 160 transferred to the second transfer carrier board 132 may include a first light-emitting unit 160R, a second light-emitting unit 160G and a third light-emitting unit 160B with different colors. For example, the first light-emitting unit 160R may be a red light-emitting unit, the second light-emitting unit 160G may be a green light-emitting unit, and the third light-emitting unit 160B may be a blue light-emitting unit, but the disclosure is not limited thereto.

In the embodiment, the light-emitting unit 160 may include a lateral LED. The light-emitting unit 160 may have a corresponding second electrically conductive terminal 165. In an embodiment, a material of the second electrically conductive terminal 165 may be the same or similar to the material of the first electrically conductive terminal 115, but the disclosure is not limited thereto. In the embodiment, one of the second electrically conductive terminals 165 on a light-emitting unit 160 may be referred to as a positive electrode, and another of the second electrically conductive terminals 165 on the light-emitting unit 160 may be referred to as a negative electrode.

In the embodiment, the light-emitting unit 160 may be a micro LED (μLED).

In the embodiment, there may be a corresponding release layer 138 between the driving unit 110 and the first transfer carrier board 131 and/or between the light-emitting unit 160 and the first transfer carrier board 131, but the disclosure is not limited thereto.

Figure 1E:
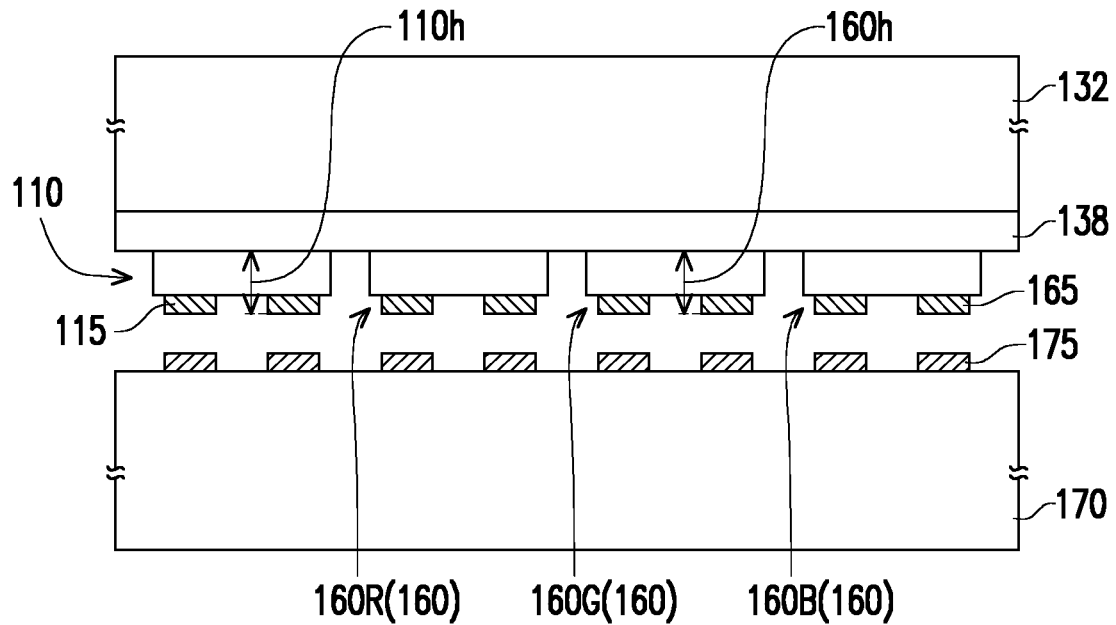
Figure 1F:
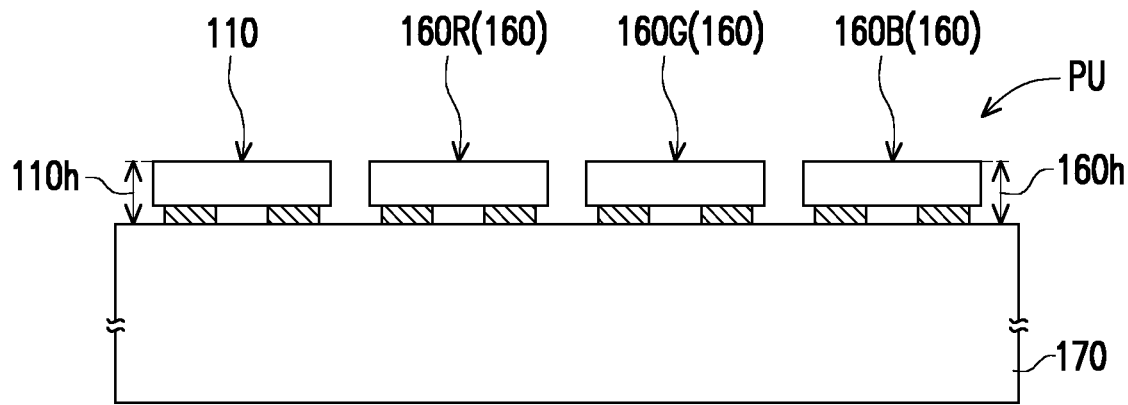

With reference to FIGS. 1E and 1F, the driving unit 110 and the light-emitting unit 160 on the second transfer carrier board 132 are transferred to a circuit substrate 170.

For example, as shown in FIG. 1E, the first electrically conductive terminal 115 of the driving unit 110 and/or the second electrically conductive terminal 165 of the light-emitting unit 160 may be facing and be very close to or in contact with a corresponding circuit (such as a corresponding connection pad 175) on the circuit substrate 170. Then, the first electrically conductive terminal 115 and/or the second electrically conductive terminal 165 may be at least partially melted by direct heating or laser heating, and is expected to be able to be in contact with the corresponding circuit on the circuit substrate 170 (hereinafter referred to as a connecting step). After that, the driving unit 110 and/or the light-emitting unit 160 may be separated (such as reducing or decomposing a bonding force of the release layer 138) from the second transfer carrier board 132 by heating or irradiation (hereinafter referred to as a separation step). In this way, a same or similar structure as shown in FIG. 1F may be formed. In addition, the above means are only illustrative examples, and are not limited by the disclosure.

In addition, for clarity, in some drawings, only some circuits (such as the corresponding connection pad 175) on the circuit substrate 170 may be shown, or a corresponding circuit on the circuit substrate 170 may be omitted.

In the embodiment, the thickness 110h of the driving unit 110 is substantially the same as a thickness 160h of the light-emitting unit 160. Therefore, the driving unit 110 and the light-emitting unit 160 on the second transfer carrier board 132 may be transferred to the circuit substrate 170 together through the same connecting step and separation step in a one-time manner. In the embodiment or similar descriptions subsequently, "the two thicknesses are substantially the same" may take into consideration fabrication accuracy and measurement-related errors (such as a cross-sectional offset or an image resolution for measurement, but are not limited thereto) and be within a range of ±30%. Preferably, it may be in a range of ±20%. In this way, the manufacturing method may be easier.

In an embodiment, taking a micro LED (μLED) serving as the light-emitting unit 160 as an example, when within a range of ±6% of the thickness 160h of the light-emitting unit 160, the thicknesses may be regarded as substantially the same.

In an embodiment, an electrical and/or luminescence test may be performed on the driving unit 110 and/or the light-emitting unit 160 after the driving unit 110 and/or the light-emitting unit 160 is transferred to the circuit substrate 170.

In an embodiment that is not shown, a defective or inefficient driving unit (such as the driving unit 110) and/or a light-emitting unit (such as the light-emitting unit 160) may be removed by a desoldering step. Then, replacement by another driving unit (such as a driving unit that is the same or similar to the driving unit 110) and/or light-emitting unit (such as a light-emitting unit that is the same or similar to the light-emitting unit 160) may be possible through means that are the same or similar to the above means.

In an embodiment, the replacement or corresponding repair of the driving unit and/or light-emitting unit may be easily performed by using a solder with a melting point lower than 260° C.

With reference to FIG. 1F, a display apparatus 100 of the embodiment may be fabricated roughly through the above manufacturing method. The display apparatus 100 includes the circuit substrate 170, the driving unit 110, and the light-emitting unit 160. The driving unit 110 is disposed on the circuit substrate 170. The light-emitting unit 160 is disposed on the circuit substrate 170. The thickness 110h of the driving unit 110 is substantially the same as the thickness 160h of the light-emitting unit 160.

In the embodiment, the first light-emitting unit 160R, the second light-emitting unit 160G the third light-emitting unit 160B, and the corresponding driving unit 110 may form a pixel unit PU. In FIG. 1F, only one of the pixel units PU in the display apparatus 100 is exemplarily shown, but the disclosure does not limit the number of the pixel units PU and a configuration means thereof. In an embodiment not shown, the number of the first light-emitting unit 160R, the second light-emitting unit 160G the third light-emitting unit 160B, or the driving unit 110 in a pixel unit may also be more than one.

In the embodiment, the circuit substrate 170 includes a passive circuit board. In an embodiment, the circuit substrate 170 may not have an active element (such as a transistor). In an embodiment, the circuit substrate 170 may only have a corresponding line. In an embodiment, the circuit substrate 170 may only have a corresponding circuit and a corresponding passive element. In an embodiment, the circuit substrate 170 may have an active element, but the active element is not used to drive the light-emitting unit 160, and such a means may also be included in the passive circuit board described in the embodiment.

In an embodiment, the circuit substrate 170 may be a rigid board. In an embodiment, the circuit substrate 170 may be a soft board. In an embodiment, the circuit substrate 170 may be a flexible and rigid bonding board.

In the embodiment, the circuit substrate 170 includes a passive circuit board, and the driving unit 110 may drive a corresponding light-emitting unit 160 through a corresponding circuit in the circuit substrate 170, so that it may emit light of a corresponding color. Therefore, cost of the circuit substrate 170 may be lower and/or the yield may be better. In addition, the driving unit 110 may be formed, transferred, and/or detected by the foregoing means. In this way, the display apparatus 100 may have a better yield or quality.

FIGS. 2A to 2F are schematic partial cross-sectional views of a part of a manufacturing method of a display apparatus according to a second embodiment of the disclosure. A manufacturing method of a display apparatus 200 of the embodiment is similar to the manufacturing method of the display apparatus 100 of the first embodiment, and the similar components are denoted by the same reference numerals, and have similar materials, functions and/or formation means, which descriptions are omitted.

Figure 2A:
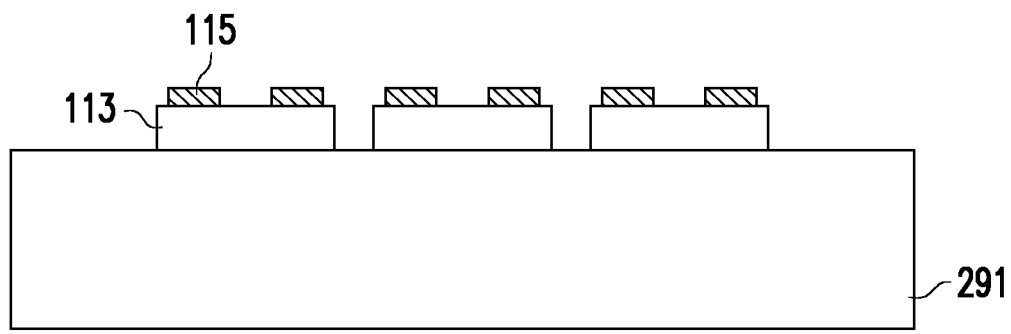
FIGS. 2A to 2F are schematic partial cross-sectional views of a part of a manufacturing method of a display apparatus according to a second embodiment of the disclosure.

With reference to FIG. 2A, a driving element 113 is formed on a substrate 291. In an embodiment, the substrate 291 may include glass, but the disclosure is not limited thereto.

Figure 2B:
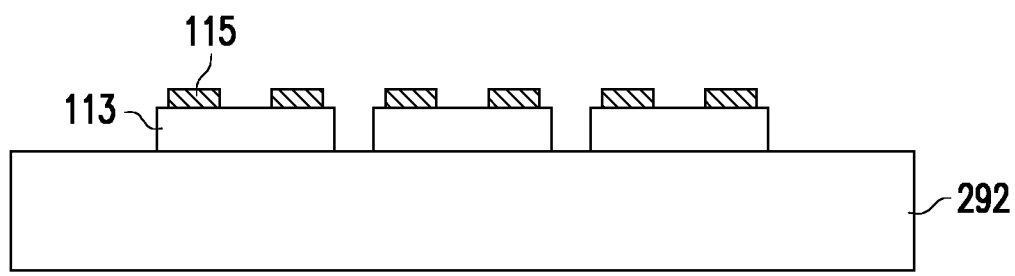

With reference to FIGS. 2A and 2B, in an embodiment, a part of the substrate 291 may be removed by grinding, etching or other suitable means to form a substrate 292 with a thinner thickness. In an embodiment, if the thickness of the substrate 291 is sufficiently thin, the foregoing thinning step may also be omitted.

In an embodiment, the substrate 291 may be disposed on a carrier board, but the disclosure is not limited thereto.

Figure 2C:
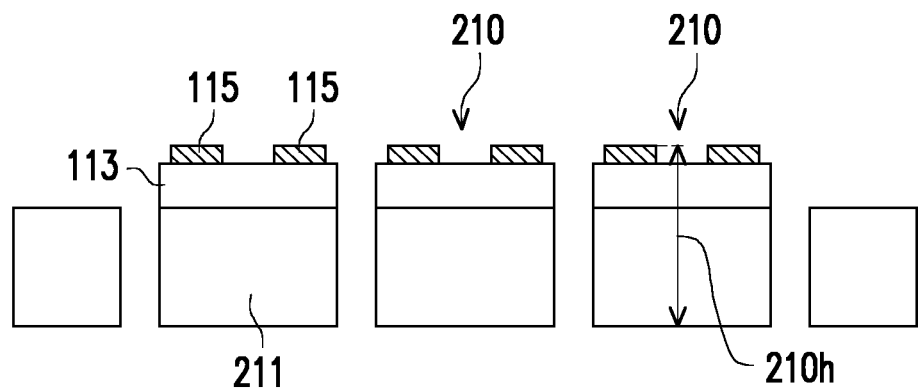

With reference to FIGS. 2B and 2C, a corresponding driving unit 210 may be formed through a singulation process. For example, a part of the substrate 292 may be removed by cutting, etching, and/or grinding, and a corresponding matrix 211 may be formed. In this way, the driving unit 210 may be at least formed by a corresponding driving element 113, the corresponding matrix 211, and a corresponding first electrically conductive terminal 115.

In an embodiment, a thickness 210h of the driving unit 210 may be easily adjusted by the thinning step.

Figure 2D:
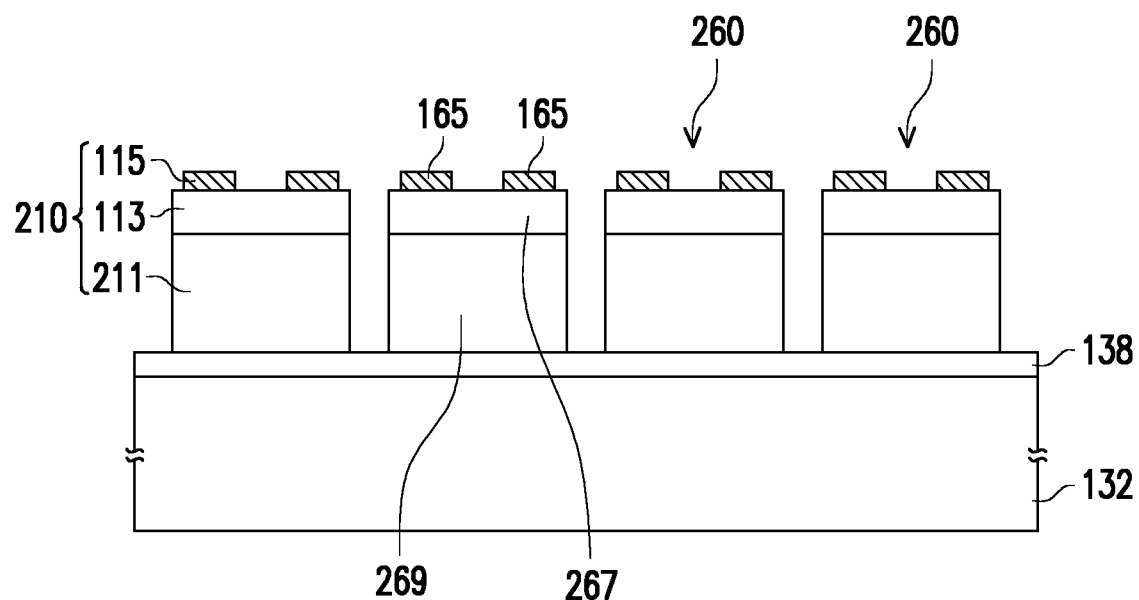

With reference to FIG. 2D, the driving unit 210 and a light-emitting unit 260 are transferred to the transfer carrier board. It should be noted that the disclosure does not limit a transfer sequence of the driving unit 210 and the light-emitting unit 260.

In the embodiment, the light-emitting unit 260 may be a sub-millimeter LED (mini LED). For example, the light-emitting unit 260 may include a substrate 269, an epitaxial layer 267 (which may include a stack of multiple film layers) located on the substrate 269, and a corresponding second electrically conductive terminal 165.

Figure 2E:
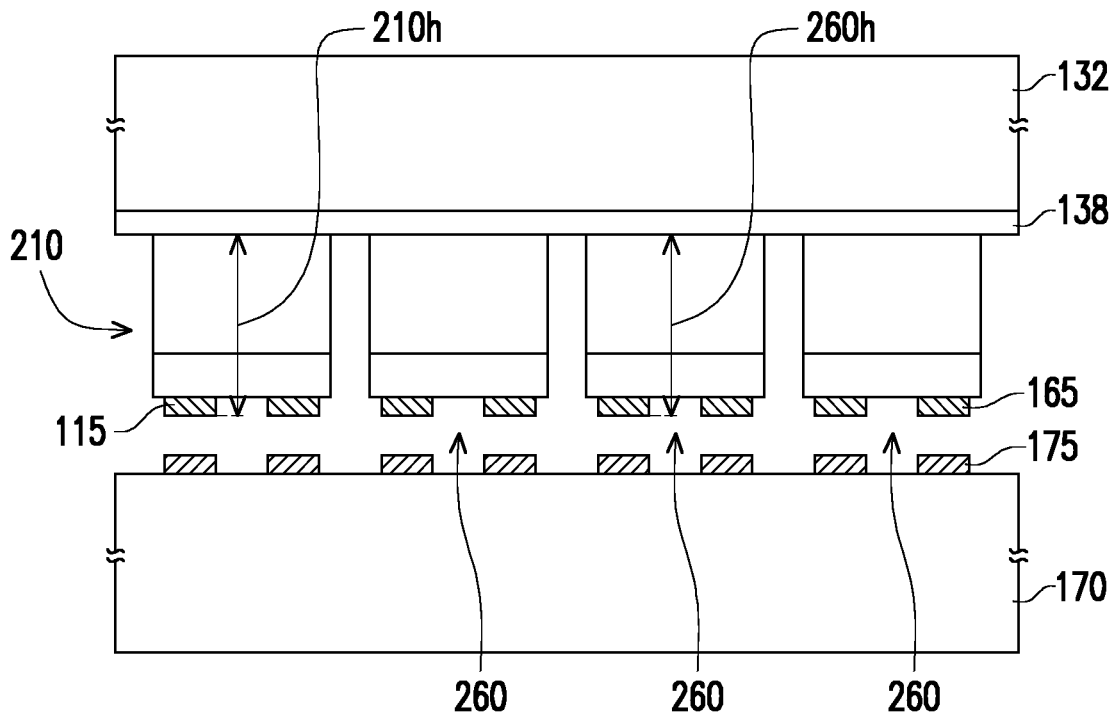
Figure 2F:
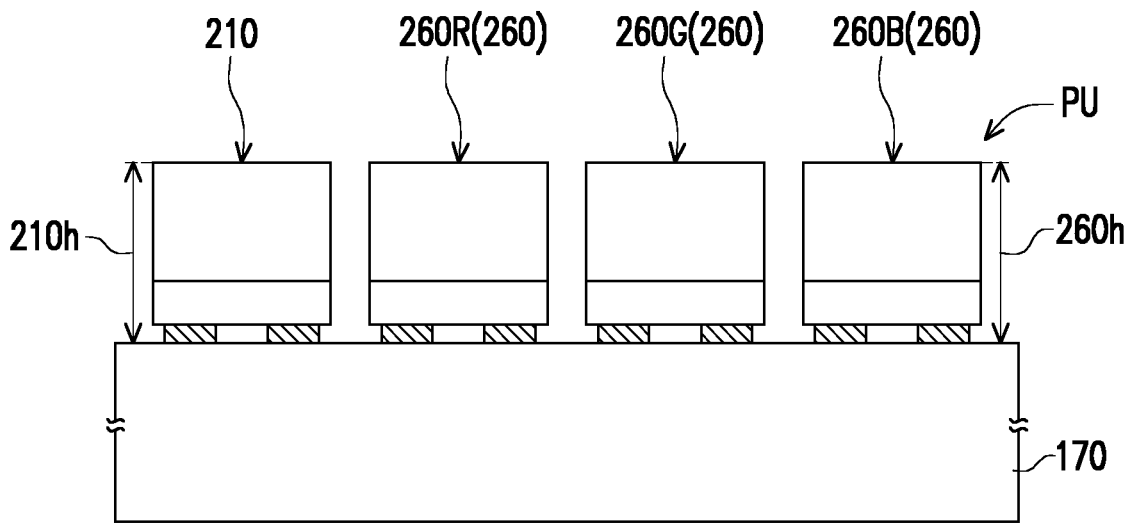

With reference to FIGS. 2E and 2F, the driving unit 210 and the light-emitting unit 260 on the second transfer carrier board 132 are transferred to the circuit substrate 170. A transfer means in FIGS. 2E and 2F may be the same or similar to the transfer means described in FIGS. 1E and 1F, which is not repeated here.

In the embodiment, the thickness 210h of the driving unit 210 and a thickness 260h of the light-emitting unit 260 are substantially the same. In this way, the manufacturing method may be easier.

In an embodiment, an electrical and/or luminescence test may be performed on the driving unit 210 and/or the light-emitting unit 260 after the driving unit 210 and/or the light-emitting unit 260 is transferred to the circuit substrate 170.

In an embodiment that is not shown, a defective or inefficient driving unit (such as the driving unit 210) and/or a light-emitting unit (such as he light-emitting unit 260) may be removed by a desoldering step. Then, replacement by another driving unit (such as a driving unit that is the same or similar to the driving unit 210) and/or light-emitting unit (such as a light-emitting unit that is the same or similar to the light-emitting unit 260) may be possible through means that are the same or similar to the above means.

In an embodiment, the replacement or corresponding repair of the driving unit and/or light-emitting unit may be easily performed by using a solder with a melting point lower than 260° C.

With reference to FIG. 2F, the display apparatus 200 of the embodiment may be fabricated roughly through the above manufacturing method. The display apparatus 200 includes the circuit substrate 170, the driving unit 210, and the light-emitting unit 260. The driving unit 210 is disposed on the circuit substrate 170. The light-emitting unit 260 is disposed on the circuit substrate 170. The thickness 210h of the driving unit 210 is substantially the same as the thickness 260h of the light-emitting unit 260.

In an embodiment, taking a mini LED serving as the light-emitting unit 260 as an example, when within a range of ±15 micrometers (μm) of the thickness 260h of the light-emitting unit 260, the thicknesses may be regarded as substantially the same.

In the embodiment, the light-emitting unit 260 includes a first light-emitting unit 260R, a second light-emitting unit 260G and a third light-emitting unit 260B with different colors. The first light-emitting unit 260R, the second light-emitting unit 260G, the third light-emitting unit 260B, and the corresponding driving unit 210 may form the pixel unit PU.

In summary, the disclosure may form a driving unit by a low-cost means (such as a low temperature poly-silicon process). Then, the driving unit and light-emitting unit are transferred from the transfer carrier board to the circuit substrate by a one-time transfer means. The driving unit or the light-emitting unit transferred to the circuit substrate may be tested, replaced or repaired accordingly. In this way, the manufacturing method of the display apparatus may be relatively simple, and the display apparatus may have a lower manufacturing cost and/or have a better yield or quality.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A display apparatus, comprising:
a circuit substrate;
a driving unit, configured on the circuit substrate; and
a light-emitting unit, configured on the circuit substrate, wherein a thickness of the driving unit is substantially same as a thickness of the light-emitting unit, wherein the driving unit comprises:
a first electrically conductive terminal, the driving unit is disposed on the circuit substrate in a manner such that the first electrically conductive terminal faces the circuit substrate, and a material of the first electrically conductive terminal includes a solder with a melting point lower than 260° C.

2. The display apparatus according to claim 1, wherein the driving unit comprises:
a matrix; and
a driving element, formed on the matrix.

3. The display apparatus according to claim 1, wherein the light-emitting unit comprises a flip-chip, a lateral, or a vertical light-emitting diode.

4. The display apparatus according to claim 1, wherein the circuit substrate comprises a passive circuit board.

5. The display apparatus according to claim 1, wherein the light-emitting unit comprises a first light-emitting unit, a second light-emitting unit, and a third light-emitting unit with different colors, and the first light-emitting unit, the second light-emitting unit, and the third light-emitting unit form a pixel unit.

6. The display apparatus according to claim 1, wherein the light-emitting unit comprises a second electrically conductive terminal, the light-emitting unit is disposed on the circuit substrate in a manner such that the second electrically conductive terminal faces the circuit substrate, and a material of the second electrically conductive terminal includes a solder with a melting point lower than 260° C.

7. The display apparatus according to claim 6, wherein the light-emitting unit comprises a flip-chip or lateral light-emitting diode.

8. A manufacturing method of a display apparatus, comprising:
providing a circuit substrate;
disposing a driving unit on the circuit substrate, wherein the driving unit comprises a first electrically conductive terminal, the driving unit is disposed on the circuit substrate in a manner such that the first electrically conductive terminal faces the circuit substrate, and a material of the first electrically conductive terminal includes a solder with a melting point lower than 260° C.; and
disposing a light-emitting unit on the circuit substrate, wherein a thickness of the driving unit is substantially same as a thickness of the light-emitting unit.

9. The manufacturing method of the display apparatus according to claim 8, further comprising:
providing a transfer carrier board;
disposing the driving unit on the transfer carrier board;
disposing the light-emitting unit on the transfer carrier board; and
transferring the driving unit and the light-emitting unit disposed on the transfer carrier board to the circuit substrate.

10. The manufacturing method of the display apparatus according to claim 8, wherein forming the driving unit comprises:
forming a matrix on a fabricated carrier board; and
forming a driving element on the fabricated carrier board, and the matrix and the driving element form the driving unit.

11. The manufacturing method of the display apparatus according to claim 8, wherein forming the driving unit comprises:
forming a driving element on a substrate; and
removing a part of the substrate to form a matrix, and the matrix and the driving element form the driving unit.

12. The manufacturing method of the display apparatus according to claim 8, the driving unit comprises:
a matrix; and
a driving element, formed on the matrix.

13. The manufacturing method of the display apparatus according to claim 8, wherein the light-emitting unit comprises a flip-chip, a lateral, or a vertical light-emitting diode.

14. The manufacturing method of the display apparatus according to claim 8, wherein the circuit substrate comprises a passive circuit board.

15. The manufacturing method of the display apparatus according to claim 8, wherein the light-emitting unit comprises a first light-emitting unit, a second light-emitting unit, and a third light-emitting unit with different colors, and the first light-emitting unit, the second light-emitting unit, and the third light-emitting unit form a pixel unit.

16. The manufacturing method of the display apparatus according to claim 8, wherein the light-emitting unit comprises a second electrically conductive terminal, the light-emitting unit is disposed on the circuit substrate in a manner such that the second electrically conductive terminal faces the circuit substrate, and a material of the second electrically conductive terminal includes a solder with a melting point lower than 260° C.

17. The manufacturing method of the display apparatus according to claim 16, wherein the light-emitting unit comprises a flip-chip or lateral light-emitting diode.

* * * * *